United States Patent [19]
Terasawa

[11] Patent Number: 6,025,233
[45] Date of Patent: Feb. 15, 2000

[54] METHOD OF MANUFACTURING A SEMICONDUCTOR DEVICE

[75] Inventor: Yoshio Terasawa, Katsuta, Japan

[73] Assignee: NGK Insulators, Ltd., Japan

[21] Appl. No.: 09/315,050

[22] Filed: May 20, 1999

Related U.S. Application Data

[62] Division of application No. 08/598,396, Feb. 8, 1996.

[30] Foreign Application Priority Data

Feb. 8, 1995 [JP] Japan .................................. 7-20417

[51] Int. Cl.$^7$ .......................... H01L 21/336; H01L 21/00
[52] U.S. Cl. .......................... 438/270; 438/138; 438/105; 438/285; 438/589; 438/931
[58] Field of Search ..................... 438/270, 271, 438/272, 268, 105, 138, 285, 589, 931, DIG. 148

[56] References Cited

U.S. PATENT DOCUMENTS

| | | | |
|---|---|---|---|
| 4,641,164 | 2/1987 | Dolny et al. ............... | 257/331 |
| 4,994,871 | 2/1991 | Chang et al. .............. | 257/331 |
| 5,164,325 | 11/1992 | Cogan et al. .............. | 438/270 |
| 5,294,814 | 3/1994 | Das ........................... | 257/77 |
| 5,371,378 | 12/1994 | Das ........................... | 257/77 |
| 5,396,085 | 3/1995 | Baliga ........................ | 257/77 |
| 5,527,720 | 6/1996 | Goodyear et al. ......... | 438/270 |
| 5,877,515 | 3/1999 | Ajit ........................... | 257/76 |

FOREIGN PATENT DOCUMENTS

| | | |
|---|---|---|
| 0 703 629 A2 | 3/1996 | European Pat. Off. . |
| 0 703 629 A3 | 3/1996 | European Pat. Off. . |
| 2-180077 | 12/1990 | Japan ................... 257/332 |
| 2 267 781 | 12/1993 | United Kingdom . |
| WO 94/13017 | 6/1994 | WIPO . |

OTHER PUBLICATIONS

Amato, M. and Rumennik, V. "Comparison of Lateral and Vertical DMOSD Specific–on–Resistance"; IEEE, IDM85, pp. 736–739.

Nikkei Electronics, 1971, pp. 50–61; Nishizawa, "High Power Vertical Type Junction FET having Triode Characteristics".

M. Bhatnagar and B. J. Baliga: "Analysis of Silicon Carbide Powder Device Performance", Proc. 3rd International Symposium on Power Semiconductor Devices and ICs, 176–180 (1991).

Mitlehner et al., "A Novel 8 KV Light–Triggered Thyristor With Overvoltage Self Protection," 1990, pp. 289–294.

Baliga, "Modern Power Devices," 1987, pp. 350–353.

Amato et al., "Comparison of Lateral and Vertical DMOS Specific On–Resistance," 1985, pp. 736–739.

Adler et al., "The Evolution of Power Device Technology," 1984, pp. 1570–1591.

(List continued on next page.)

*Primary Examiner*—Michael Trinh
*Attorney, Agent, or Firm*—Parkhurst & Wendel, L.L.P.

[57] ABSTRACT

A vertical type semiconductor device having a semiconductor substrate and at least one gate electrode structure formed in the semiconductor substrate for controlling a current flow across the semiconductor substrate. The semiconductor substrate is formed by a silicon substrate, a silicon carbide or diamond layer epitaxially deposited on the silicon substrate, and a silicon layer epitaxially deposited on the silicon carbide or diamond layer. Recesses are formed in the silicon layer and gate electrodes are provided in the recesses via silicon oxide films. Source or emitter regions are formed in portions of the silicon layer which are brought into contact with the silicon oxide films by inverting the conductivity of these portions. Source or emitter electrodes are provided on the source or emitter regions, and a drain or collector electrode is provided on a rear surface of the silicon substrate.

6 Claims, 10 Drawing Sheets

OTHER PUBLICATIONS

Ishidoh et al., "Advanced High Frequency GTO," 1988, pp. 189–194.

Nishizawa et al., "Analysis of Characteristic of Static Induction Thyristor," 1981, pp. 31–38.

Nishizawa et al., "Effects of Gate Structure on Static Induction Thyristor," 1980, pp. 658–661.

Nishizawa et al., "Static Induction Thyristor," 1978, pp. 725–728.

Nishizawa et al., "Field–Effect Transistor Versus Analog Transistor (Static Induction Transistor)," 1975, pp. 185–197.

Patent Abstracts of Japan, vol. 013, No. 493 (E–842), Nov. 8, 1989 & JP 01 196873 A (Sharp Corp), Aug. 8, 1989, *abstract*.

Patent Abstracts of Japan, vol. 013, No. 493 (E–842), Nov. 8, 1989 & JP 01 196874 A (Nippon Denso Co., Ltd.), Aug. 8, 1989, *abstract*.

FIG._3
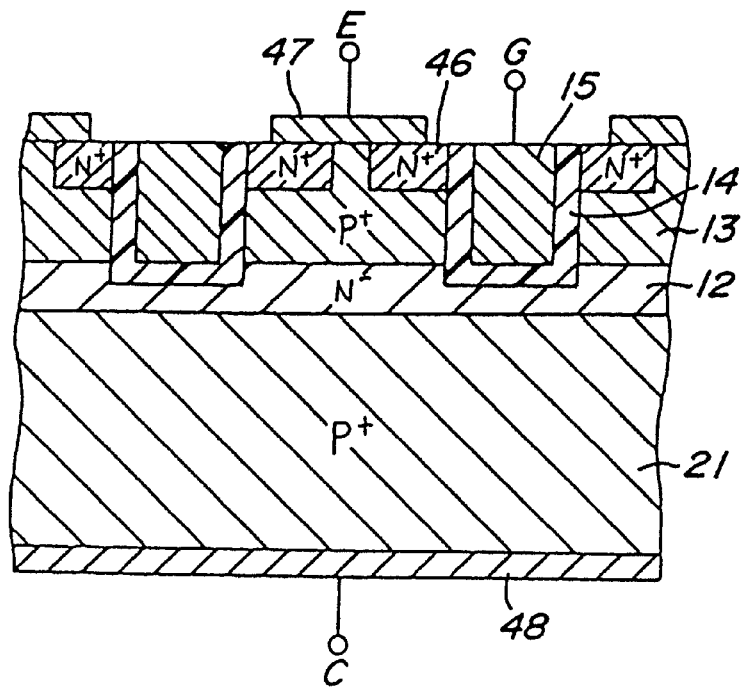
FIG._4
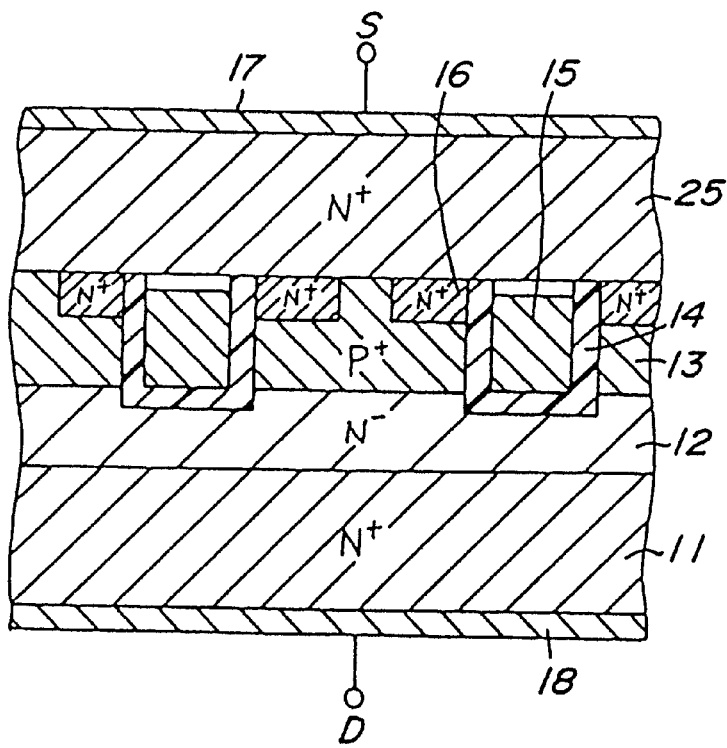

FIG._14A
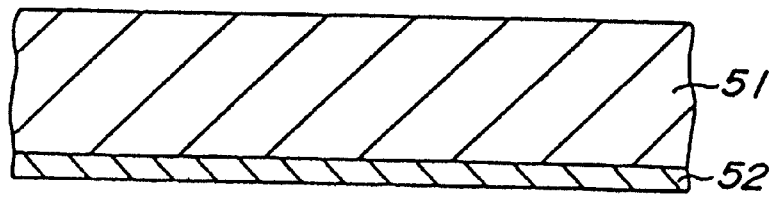
FIG._14B
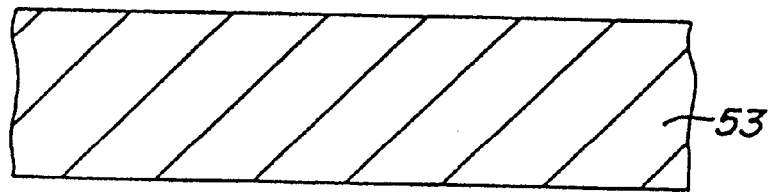
FIG._14C
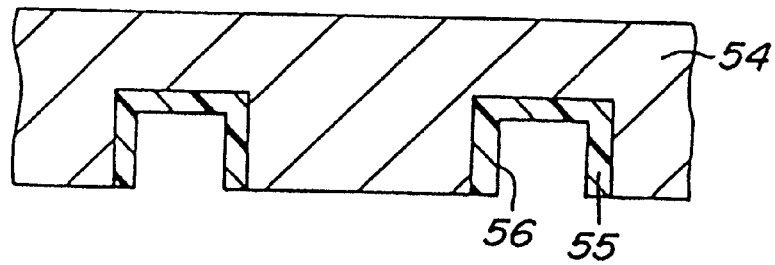
FIG._14D
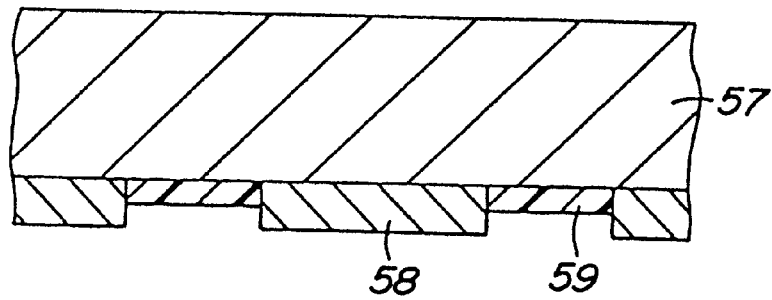

FIG_15A
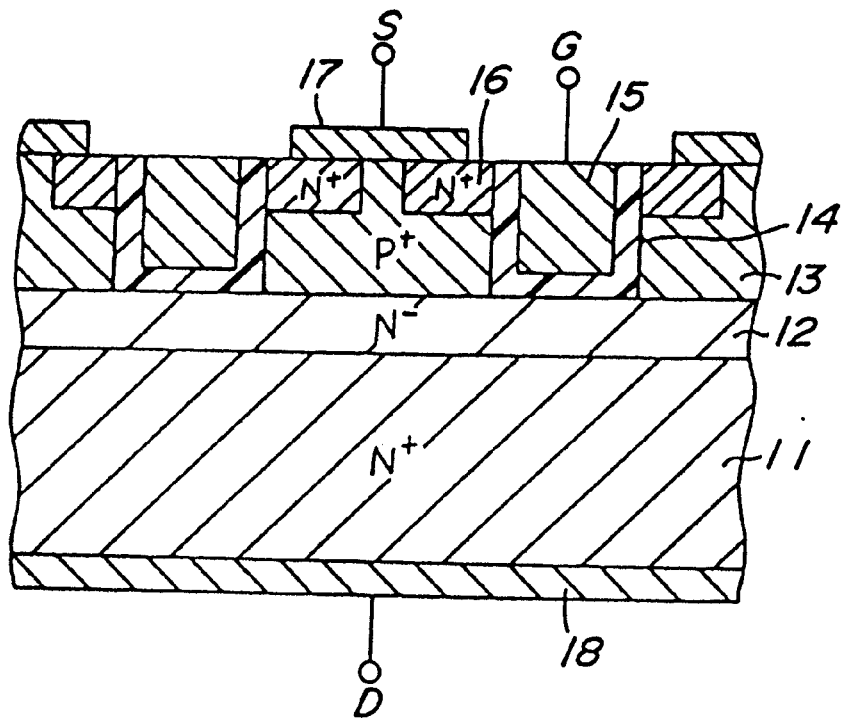
FIG_15B
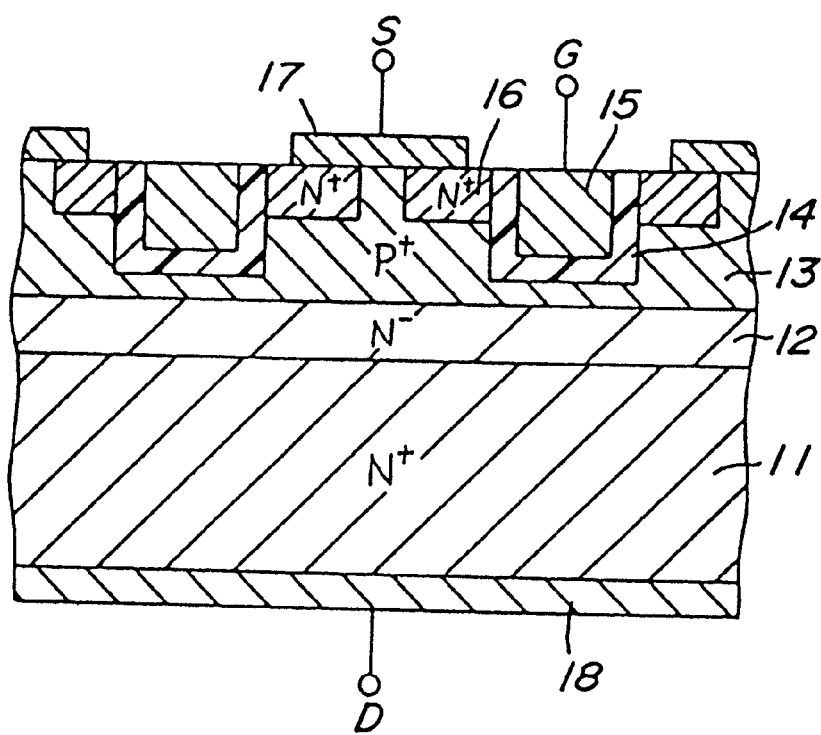

METHOD OF MANUFACTURING A SEMICONDUCTOR DEVICE

This is a Division of application Ser. No. 08/598,396 filed Feb. 8, 1996, now allowed.

BACKGROUND OF THE INVENTION

1. Field of the Invention

The present invention relates to a semiconductor device and a method of manufacturing the same, and more particularly to a vertical type power semiconductor device such as a power MOSFET (Metal Oxide Silicon Field Effect Transistor), an SI (Static Induction) thyristor, and an IGBT (Insulated Gate Bipolar Transistor) power transistor, and to a method of manufacturing such a vertical type power semiconductor device.

2. Description of Related Art

The above mentioned vertical type power semiconductor devices have been widely used as a power semiconductor device and has been described in the following documents.
1. Junichi Nishizawa: "High Power Vertical Type Junction FET having Triode Characteristics", Nikkei Electronics, Sep. 27, 1971, pp. 50–61
2. J. Nishizawa, T. Terasaki and J. Shibata: "Field-Effect Transistor versus Analog Transistor (Static Induction Transistor)", IEEE Trans. on Electron Device, ED-22(4), 185 (1975)
3. J. Nishizawa and K. Nakamura: Physiquee Appliquee, T13, 725(1978)
4. J. Nishizawa and Y. Otsubo: Tech. Dig. 1980 IEDM, 658 (1980)
5. J. Nishizawa, T. Ohmi, T. Sha and K. Mototani: Technological Report of the Electron and Communication Society, ED81–84 (1981)
6. M. Ishidoh, et al: "Advanced High Frequency GTO", Proc. ISPSD, 189 (1988)
7. B. J. Baliga, et al: "The Evolution of Power Device Technology", IEEE Trans. on Electron Device, ED-31, 1570 (1984)
8. M. Amato, et al: "Comparison of Lateral and Vertical DMOS Specific On-resistance", IEDM Tech. Dig., 736 (1985)
9. B. J. Baliga: "Modern Power Device", John Wiley Sons, 350 (1987)
10. H. Mitlehner, et al: "A Novel 8kV Light-Trigger Thyristor with Over Voltage Self Protection", Proc. ISPSD, 289 (1990)

In the semiconductor device of the type mentioned above, a current passing between main electrodes can be controlled by controlling a gate voltage, so that such semiconductor device may be advantageously used in a power transducer and switching power source as a high speed switching element. Particularly, in a vertical type semiconductor device in which a current flows vertically within a substrate, it is possible to control a very large current.

In such a semiconductor device, a silicon substrate has been generally used as a semiconductor substrate. In the silicon substrate there are formed channels and currents pass through these channels and semiconductor regions adjacent to the channels.

In the power semiconductor device, a channel and adjoining semiconductor regions have certain resistance even in a conductive state (generally termed as an on-resistance). Therefore, heat is generated during the conduction state. In the case of a the silicon substrate, a threshold temperature below which the device operates safely is about one hundred and several tens degree in Celsius's temperature scale. Therefore, when a large current flows, a semiconductor breakdown voltage of device might be decreased and an efficiency of the device might be reduced by a loss due to heat. Therefore, it has been proposed to decrease the on-resistance as much as possible. For instance, in order to reduce a resistance of the channel, it has been proposed to reduce a length of the channel. However, this solution is limited by a fine working, so that the channel resistance could not be decreased to a desired value.

It has been further proposed to make a semiconductor substrate of a material having a higher threshold temperature for safety operation. Such a solution has been described in the following reference.
11. M. Bhatnagar and B. J. Baliga:
"ANALYSIS OF SILICON CARBIDE POWER DEVICE PERFORMANCE"
Proc. 3rd International Symposium on Power Semiconductor Devices and Ics, 176–180 (1991)

In this reference, it is proposed to use a silicon carbide substrate in a vertical type semiconductor device. As compared with the silicon substrate, the silicon carbide substrate has several advantages such as a wide band gap, high electron mobility, high saturation drift velocity, high thermal conduction and high breakdown voltage. Such properties show that the silicon carbide substrate is particularly suitable for power semiconductor devices. However, it is practically very difficult to manufacture a semiconductor device comprising a silicon carbide substrate. Therefore, in the above reference, characteristics of SiC power MOS FET are derived by theoretical calculations. This simulation indicates that the on-resistance of the SiC power MOS FET is smaller than that of the Si power MOS FET by about 2000 times and a breakdown voltage of the SiC power MOS FET amounts to about 5000V.

As stated above, it is practically difficult to form the silicon carbide substrate having good properties. Thus, it is not possible to realize the power semiconductor device having excellent characteristics even if the theoretical calculation indicates such excellent characteristics. Furthermore, while, a silicon carbide substrate could be manufactured, the cost of the silicon carbide substrate is higher than the silicon substrate. Since the silicon carbide substrate can be treated or machined only with difficulty, a manufacturing cost of the silicon carbide substrate would become very expensive.

SUMMARY OF THE INVENTION

The present invention has for its object to provide a novel and useful semiconductor device which can mitigate the above mentioned drawbacks by using a hybrid type semiconductor substrate, in which a high breakdown voltage can be attained even if a thickness of the substrate is small and thus the on-resistance can be reduced and heat generation can be suppressed, a loss due to heat generation can be reduced, and the substrate can be manufactured easily at a low cost.

According to the invention, a vertical type semiconductor device comprising a semiconductor substrate having a first main surface and a second main surface being opposite to the first main surface; and at least one control electrode region formed in said semiconductor substrate, whereby a current passing between said first and second main surfaces of the semiconductor substrate is controlled by controlling a voltage applied to said control electrode region, wherein said semiconductor substrate is formed by a hybrid structure semiconductor substrate including a first substrate made of silicon and a second semiconductor substrate made of a semiconductor material having a band gap wider than that of the first substrate of silicon.

In a preferable embodiment of the semiconductor device according to the invention, said semiconductor substrate is formed by a silicon substrate, a wide band-gap semiconductor substrate formed on the silicon substrate and a silicon epitaxial layer formed epitaxially on the wide band-gap semiconductor substrate. Said wide band-gap semiconductor substrate may be formed by silicon carbide, diamond or composite material of silicon carbide and diamond. In the case of using the wide band-gap substrate formed by the composite material, it is preferable to use a silicon carbide substrate having a diamond layer applied thereon, because diamond can be epitaxially deposited on the silicon carbide substrate.

According to the invention, the semiconductor device may be advantageously constructed as a MOS FET by using the above mentioned hybrid-type semiconductor substrate. In an embodiment of the semiconductor device according to the invention, the semiconductor substrate is formed by a silicon substrate of one conductivity type, a wide band-gap semiconductor material layer epitaxially grown on a surface of said silicon substrate and made of a semiconductor material of opposite conductivity type and having a low impurity concentration, and a silicon layer epitaxially deposited on said wide band-gap semiconductor material layer and made of silicon having a high impurity concentration. In said silicon layer there are formed recesses having a such depth that the surface of said wide band-gap semiconductor material layer is exposed or a part of said silicon layer is left under the recesses to such an extent that a depth of said remaining part of the silicon layer amounts to a depth of an inverted channel to be formed in the silicon layer during operation. A silicon oxide film is formed on an inner surface of said recess, a gate electrode is formed on said silicon oxide film, a source region is formed by inverting the conductivity type of a part of the silicon layer which adjoins said silicon oxide film, a source electrode is formed on said source region, and a drain electrode is formed on a rear surface of said silicon substrate.

In another embodiment of the semiconductor device according to the invention, the semiconductor device is constructed as an IGBT. The semiconductor substrate is formed by a silicon substrate of one conductivity type, a first silicon layer of the opposite conductivity type formed on a surface of said silicon substrate and having a high impurity concentration, a wide band-gap semiconductor material layer epitaxially grown on a surface of said first silicon layer and made of a semiconductor material of the opposite conductivity type and having a low impurity concentration, and a second silicon layer epitaxially deposited on said wide band-gap semiconductor material layer and made of silicon of the opposite conductivity type having a high impurity concentration. In said second silicon layer there are formed recesses having such a depth that the surface of said wide band-gap semiconductor material layer is exposed or a part of said second silicon layer is left under the recesses to such an extent that a depth of said remaining part of the second silicon layer amounts to a depth of an inverted channel which is formed in the second silicon layer during operation. A silicon oxide film is formed on an inner surface of said recess, a gate electrode is formed on said silicon oxide film, an emitter region is formed by inverting the conductivity type of a part of the second silicon layer which adjoins said silicon oxide film, an emitter electrode is formed on said emitter region, and a collector electrode is formed on a rear surface of said silicon substrate.

In another embodiment of the semiconductor device constituted as an IGBT according to the invention, the semiconductor substrate is formed by a silicon substrate of one conductivity type, a wide band-gap semiconductor material layer epitaxially deposited on a surface of said silicon substrate and made of a semiconductor material of the opposite conductivity type and having a low impurity concentration, and a silicon layer epitaxially grown on said wide band-gap semiconductor material layer and made of silicon having a high impurity concentration. In said silicon layer there are formed recesses having such a depth that the surface of said wide band-gap semiconductor material layer is exposed or a part of said silicon layer is left under the recesses to such an extent that a depth of said remaining part of the silicon layer amounts to a depth of an inverted channel to be formed in the silicon layer during operation. A silicon oxide film is formed on an inner surface of said recess, a gate electrode is formed on said silicon oxide film, an emitter region is formed by inverting the conductivity type of a part of the silicon layer which adjoins said silicon oxide film, an emitter electrode is formed on said emitter region, and a collector electrode is formed on a rear surface of said silicon substrate.

In the semiconductor device according to the invention, the semiconductor substrate is formed by, for instance, a silicon substrate, a wide band-gap semiconductor material layer epitaxially deposited on said silicon substrate and a silicon layer epitaxially deposited on the wide band-gap semiconductor material layer. Since the wide band-gap semiconductor material layer has a higher breakdown property than the silicon substrate, the wide band-gap semiconductor material layer can be thin, and therefore on-resistance can be decreased. Therefore, an amount of heat generated by the semiconductor device can be decreased. Moreover, the upper silicon layer can be easily worked or machined and can be formed to have excellent characteristics at a low cost as compared with a case in which a whole substrate is made of a wide band-gap semiconductor material such as silicon carbide and diamond. Therefore, a cost of the semiconductor device can be reduced.

BRIEF EXPLANATION OF THE DRAWINGS

FIG. 3 is a cross sectional view depicting a second embodiment of the semiconductor device formed as an IGBT according to the invention;

FIG. 4 is a cross sectional view showing an embodiment of the semiconductor device according to the invention formed as a joint-type MOS FET;

FIGS. 14A–14D are cross sectional views depicting several embodiments of the substrate to be used in the embodiments shown in FIGS. 4 and 5; and FIGS. 15A and 15B are cross sectional views showing still another modification of the embodiment of the semiconductor device depicted in FIG. 1 according to the invention.

DESCRIPTION OF THE PREFERRED EMBODIMENTS

Figure 1:
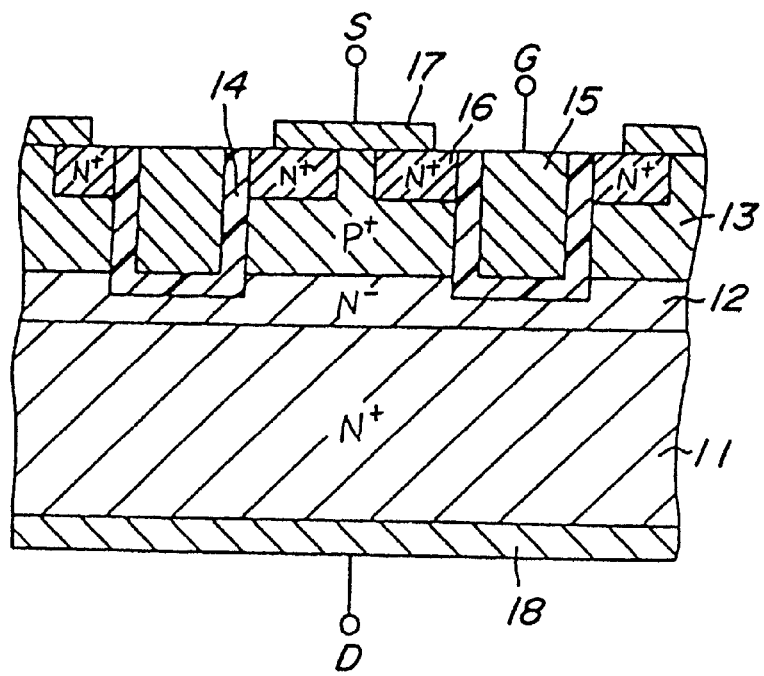
FIG. 1 is a cross sectional view showing an embodiment of the semiconductor device formed as MOS FET according to the invention.

FIG. 1 is a cross sectional view showing an embodiment of the semiconductor device according to the invention. In the present embodiment, the semiconductor device is formed as a power MOS FET. The semiconductor device comprises a semiconductor substrate formed by an N$^+$ type silicon substrate 11 having an impurity concentration of $3 \times 10^{18}$ atoms/cm$^3$ and a thickness of about 300 microns. The semiconductor substrate further comprises an N$^-$ type silicon carbide layer 12 epitaxially grown on a surface of the silicon substrate 11. The silicon carbide layer 12 has an impurity concentration of $5 \times 10^{16}$ atoms/cm$^3$ and a thickness of about 10 microns. The semiconductor substrate further includes a P$^+$ type silicon layer 13 epitaxially deposited on a surface of the silicon carbide layer 12. The silicon layer 13 has an impurity concentration of $1 \times 10^{18}$ atoms/cm$^3$ and a thickness of about 20 microns.

In the present embodiment, there are formed recesses in the silicon layer 13 such that the recesses reach the silicon carbide layer 12 and partially penetrate into the silicon carbide layer. The surface of the recesses is covered with a silicon oxide film 14. The silicon oxide film 14 may be formed by thermal oxidation or CVD using a TEOS (tetra ethoxysilane) gas. On the silicon oxide film 14, there are deposited gate electrodes 15. N$^+$ type source regions 16 are formed in the P$^+$ type silicon layer 13 by inverting the conductivity type of surface parts of the silicon layer which are brought into contact with the silicon oxide film 14. The source regions 16 have an impurity concentration of about $1 \times 10^{19}$ atoms/cm$^3$. On the source regions 16 are formed source electrodes 17 made of aluminum. On a rear surface of the silicon substrate 11 is formed a drain electrode 18 by depositing aluminum.

During the operation of the MOS FET having the construction explained above, a bias voltage is applied across the drain electrode 18 and the source electrode 17 such that the drain is positive and the source is negative. When no gate voltage is applied to the gate electrode 15, no inverted channel is formed at portions of the P$^+$ type silicon layer 13 which are brought into contact with the silicon oxide film 14, so that electrons supplied from the source electrode 17 are not conducted to the silicon carbide layer 12. Therefore, no current flows between the source electrode 17 and the drain electrode 18 and the semiconductor device is in an off- or non-conductive condition. In this case, a breakdown voltage is determined by a depletion layer produced by the P$^+$ type silicon layer 13 and N$^-$ silicon carbide layer 12. Silicon carbide has a wider band-gap than the silicon and a breakdown voltage of silicon carbide is higher than that of silicon by about one order. Therefore, a thickness of the silicon carbide layer can be reduced.

When a positive voltage is applied to the gate electrode 15, negative charge is induced in portions of the silicon layer 13 adjoining the silicon oxide film 14 and an inverted channel is formed therein. Therefore, a current passes from the drain electrode 18 to the source electrode 17 via the silicon substrate 11, N$^-$ silicon carbide layer 12, the inversion layer formed in the P$^+$ type silicon layer 13 and the source region 16.

As stated above, the silicon carbide layer 12 has a high breakdown voltage and can be thin. Therefore, on-resistance can be decreased. Thus an amount of heat generated by the semiconductor device can be reduced and a loss due to heat can be decreased. Furthermore, the inverted channel is formed within the silicon layer 13 whose impurity concentration can be easily and precisely controlled, and thus a desired property can be realized. Moreover, the recess for forming the inversion layer is formed within the silicon layer 13, and therefore the recess can be easily formed. In order to realize a high speed device for switching a current at a high speed, it is required to extinguish carriers at a high speed. To this end, a process for reducing a life time of carriers has to be performed for the semiconductor substrate For instance, gold ions have to be added or electron bombardment process has to be performed. However, such a process might increase the on-resistance and a loss due to heat might be increased. According to the invention, the silicon substrate includes the wide band-gap semiconductor material layer having a small thickness, so that the on-resistance can be reduced. Therefore, even though the above mentioned process for reducing life time of carriers is performed to increase extinguishing speed of carriers, it is possible to realize the semiconductor device having low loss due to on-resistance. Moreover, silicon carbide or diamond has a higher heat conduction than silicon, heat generated at the channel can be dissipated speedily and a heat resistance of the device can be improved.

In the present invention, by using the semiconductor substrate of hybrid structure having a silicon substrate and a wide band-gap semiconductor material layer, the semiconductor substrate according to the invention has both a property of silicon such as low cost, easy workability and easy formation and a property of wide band-gap semiconductor material such as a high breakdown voltage.

Figure 2:
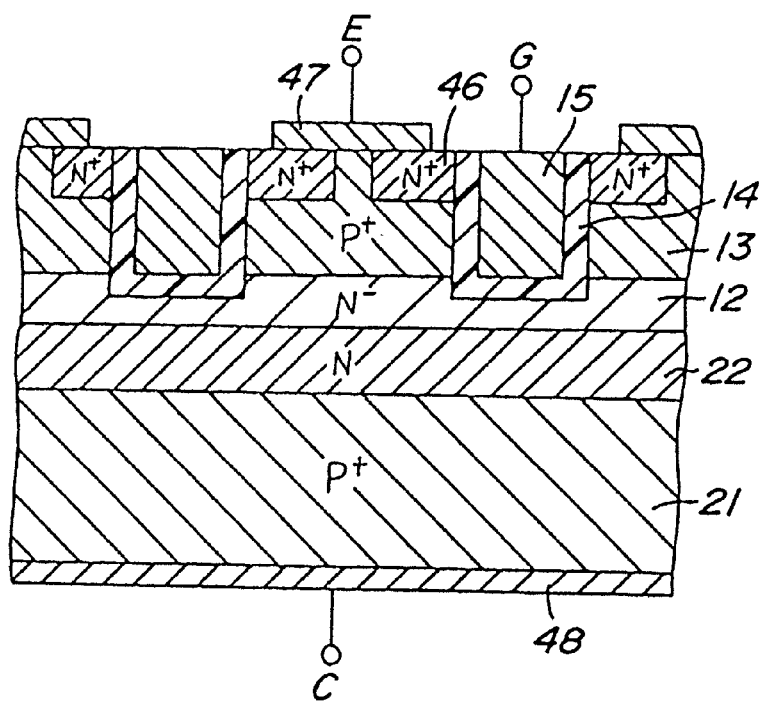
FIG. 2 is a cross sectional view illustrating a first embodiment of the semiconductor device constituted as an IGBT according to the invention.

FIG. 2 is a cross sectional view showing an embodiment of the semiconductor device constructed as IGBT according to the invention. In the present embodiment, a semiconductor substrate is formed by a P$^+$ type silicon substrate 21 having an impurity concentration of about $3 \times 10^{18}$ atoms/cm$^3$, N type first silicon layer 22 epitaxially deposited on a surface of the silicon substrate 21 and having an impurity concentration of about $1 \times 10^{17}$ atoms/cm$^3$ and a thickness of about 10 microns, N$^-$ type silicon carbide layer 12 epitaxially grown on a surface of the first silicon layer 22 and having an impurity concentration of $5 \times 10^{16}$ atoms/cm$^3$ and having a thickness of about 10 microns, and a second P$^+$ type silicon layer 13 epitaxially deposited on a surface of the silicon carbide layer 12. The second silicon layer 13 has an impurity concentration of $1 \times 10^{16}$ atoms/cm$^3$ and a thickness of about 20 micron. In a surface region of the second silicon layer 13 are formed N$^+$ type emitter regions 46 and emitter electrodes 47 are formed on the emitter regions. On a rear surface of the silicon substrate 11 is formed a collector electrode 48.

In the IGBT of the present embodiment, a bias voltage is applied across the collector electrode 48 and the emitter electrode 47 such that the collector electrode becomes positive and the emitter electrode becomes negative. When a voltage is not applied to the gate electrode 15, an inverted channel is not generated at portions of the P$^+$ type second silicon layer 13 which are brought into contact with the silicon oxide film 14, so that electrons supplied from the source electrode 17 are not conducted into the silicon carbide layer 12. Therefore, no current flows between the collector electrode 48 and the emitter electrode 47, so that the semiconductor device is in a cut-off state. When a positive voltage is applied to the gate electrode 15, negative charge is induced in portions of the second silicon layer 13 adjoining the silicon oxide film 14 and an inverted channel is formed therein. Therefore, an electron current flows into the N$^-$ type silicon carbide layer 12 serving as a drift layer. Then, holes are injected from the P$^+$ type silicon layer 21 and minority carriers are stored in the N$^-$ silicon carbide layer 12. In this manner, a large current passes from the collector electrode 48 to the emitter electrode 47 via the silicon substrate 21, N type first silicon layer 22, N$^-$ silicon carbide layer 12, the inversion channel and emitter region 46. In this case, the N$^-$ silicon carbide layer 12 serves as the drift layer having a high breakdown electric field strength, and therefore a desired breakdown voltage can be attained by using a thin silicon carbide layer. Thus, on-resistance can be decreased and loss due to heat generation can be reduced.

On-resistance of the power MOS FET is mainly determined by the N$^-$ silicon carbide layer 12 having a high resistance. When minority carriers, i.e. holes are stored in this silicon carbide layer, a concentration of majority carriers, i.e. electrons is also increased (conductivity modulation), and thus the on-resistance of the IGBT becomes lower than that of the MOS FET.

FIG. 3 is a cross sectional view showing another embodiment of the semiconductor device formed as an IGBT according to the invention. Also in this embodiment, portions similar to those shown in FIG. 2 are denoted by the same reference numerals used in FIG. 2. In the present embodiment, a semiconductor substrate is formed by an P$^+$ type silicon substrate 21 having an impurity concentration of about $3 \times 10^{18}$ atoms/cm$^3$, an N$^-$ type silicon carbide layer 12 epitaxially grown on a surface of the silicon substrate 21 and having an impurity concentration of $5 \times 10^{16}$ atoms/cm$^3$ and a thickness of about 10 microns, and a P$^+$ type silicon layer 13 epitaxially deposited on a surface of the silicon carbide layer 12. The silicon layer 13 has an impurity concentration of $3 \times 10^{18}$ atoms/cm$^3$ and a thickness of about 20 microns. On a rear surface of the silicon substrate 21 is formed a collector electrode 48. The present embodiment has similar advantages to those of the embodiment illustrated in FIG. 2.

FIG. 4 is a cross sectional view depicting another embodiment of the semiconductor device according to the invention constituted as a MOS FET. In the present embodiment, portions similar to those of the embodiment shown in FIG. 1 are denoted by the same reference numerals used in FIG. 1. In the present embodiment, a semiconductor substrate is formed by an N$^+$ type silicon substrate 11 having a high impurity concentration of about $3 \times 10^{18}$ atoms/cm$^3$, an N$^-$ type silicon carbide layer 12 epitaxially grown on a surface of the silicon substrate 11 and having an impurity concentration of about $5 \times 10^{15}$ atoms/cm$^3$, and a P$^+$ type silicon layer 13 epitaxially grown on a surface of the silicon carbide layer 12 and having an impurity concentration of about $1 \times 10^{18}$ atoms/cm$^3$.

In the silicon layer 13, there are formed recesses which extend through the silicon layer 13 and partially penetrate into the silicon carbide layer 12. A surface of the recesses is covered with a silicon oxide film 14, and gate electrodes 15 are formed on the silicon oxide film 14. N$^+$ type source regions 16 are formed in surface regions of the P$^+$ type silicon layer 13 which are brought into contact with the silicon oxide film 14. The source regions 16 have a high impurity concentration of about $1 \times 10^{19}$ atoms/cm$^3$. On the source regions 16 are formed source electrodes 17 made of aluminum. On a rear surface of the silicon substrate 11 is formed a drain electrode 18 by depositing aluminum. The construction so far explained is similar to that of the first embodiment illustrated in FIG. 1.

In the present embodiment, an N$^+$ type second silicon substrate 25 having a high impurity concentration of about $1 \times 10^{19}$ atoms/cm$^3$ is joined to a surface of the silicon layer 13, and a source electrode 17 is formed on a surface of the second silicon substrate 25. It should be noted that the gate electrodes 15 are formed such that they do not contact the second silicon substrate 25. That is to say, the recesses are not fully filed with the gate electrodes 15, but spaces are formed on the gate electrodes.

In the present embodiment, since the second silicon substrate 25 is joined to the silicon layer 13, it is possible to form the single source electrode 17 commonly for all elements. Moreover, a depth of the recesses can be shallow, so that the construction is preferable for fine working.

Figure 5:
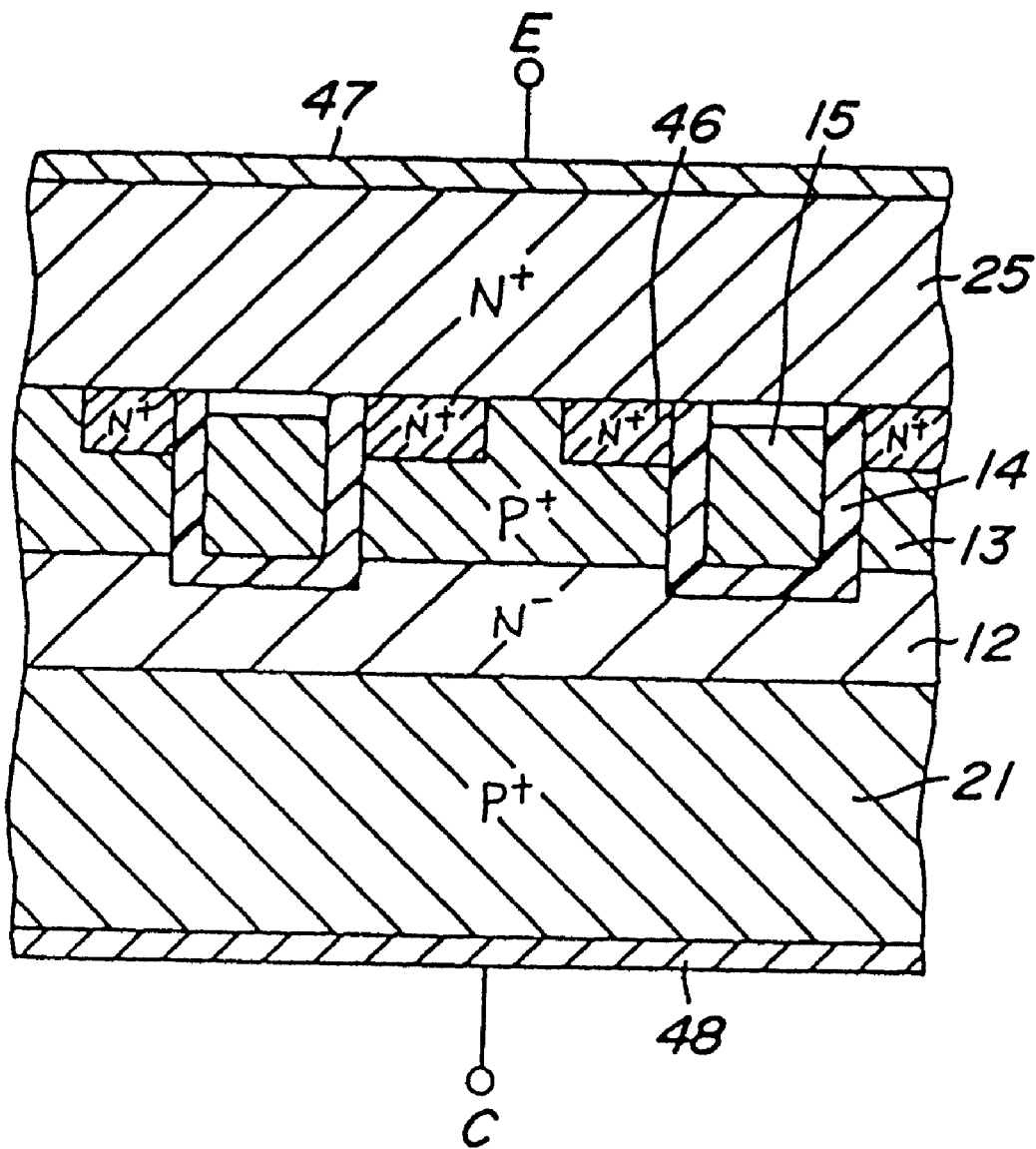
FIG. 5 is a cross sectional view depicting an embodiment of the semiconductor device according to the invention constituted as joint-type IGBT.

FIG. 5 is a cross sectional view showing another embodiment of the semiconductor device formed as an IGBT according to the invention. In the present embodiment, portions similar to those illustrated in FIG. 2 are denoted by the same reference numerals used in FIG. 2. In the present embodiment, a semiconductor substrate is formed by a P$^+$ type silicon substrate 21 having an impurity concentration of about $3 \times 10^{18}$ atoms/cm$^3$, an N$^-$ type silicon carbide layer 12 epitaxially grown on a surface of the silicon substrate 21 and having an impurity concentration of $5 \times 10^{15}$ atoms/cm$^3$, and a P$^+$ type silicon layer 13 epitaxially deposited on a surface of the silicon carbide layer 12 and having an impurity concentration of $3 \times 10^{18}$ atoms/cm$^3$, said silicon layer 13 serving as a base region. In the silicon layer 13 there are formed recesses such that the recesses partially penetrate into the silicon carbide layer 12. A silicon oxide film 14 is formed on an inner wall of the recesses and gate electrodes 15 are formed on the silicon oxide film. N$^+$ type emitter regions 46 are formed in surface regions of the silicon layer 13 which are brought into contact with the silicon oxide film 14 and emitter electrodes 47 are formed on the emitter regions 46. A collector electrode 48 is formed on a rear surface of the silicon substrate 21.

In the present embodiment, an N$^+$ type second silicon substrate 25 having a high impurity concentration of about $1 \times 10^{19}$ atoms/cm$^3$ is joined to a surface of the silicon layer 13, and an emitter electrode 47 is formed on a surface of the second silicon substrate 25. As in the embodiment shown in FIG. 4, the gate electrodes 15 are formed such that they are not brought into contact with the second silicon substrate 25. In the present embodiment, the emitter electrode 47 can be formed commonly for all the elements, and a depth of the recesses can be made small.

FIGS. 6A to 6F are cross sectional views illustrating successive steps of an embodiment of the method of manufacturing the semiconductor device according to the invention. In the present embodiment, the power MOS FET shown in FIG. 1 is manufactured.

Figure 6A:
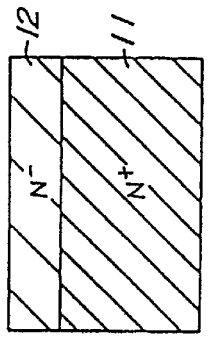
FIGS. 6A–6F are cross sectional views showing successive steps for manufacturing the semiconductor device shown in FIG. 1 according to the invention.
Figure 6B:
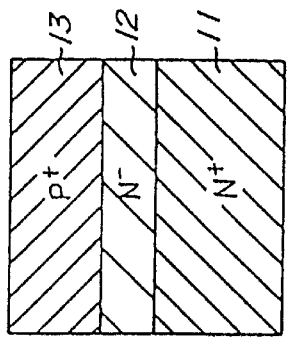

As shown in FIG. 6A, an N$^+$ type silicon substrate 11 having an impurity concentration of $3 \times 10^{18}$ atoms/cm$^3$ and a thickness of about 300 microns is prepared. Then, an N type silicon carbide layer 12 having a low impurity concentration of $5 \times 10^{16}$ atoms/cm$^3$ is epitaxially grown on a surface of the silicon substrate 11 such that the silicon carbide layer 12 has a thickness of about 10 microns. Next, as illustrated in FIG. 6B, a P$^+$ type silicon layer 13 having an impurity concentration of $1 \times 10^{18}$ atoms/cm$^3$ and a thickness of about 20 microns is epitaxially deposited on a surface of the silicon carbide layer 12.

Figure 6C:
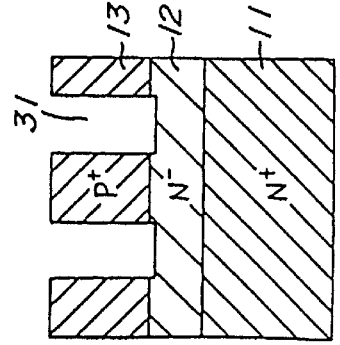

Then, after forming a mask having a desired pattern is formed on the silicon layer 13, recesses 31 are formed in the silicon layer 13 by anisotropic etching as shown in FIG. 6C. In the present embodiment, during the formation of the recesses 31, a surface of the silicon layer 13 is partially etched away, but according to the invention, it is not always necessary to perform such etching. This will be explained further in detail.

Figure 6D:
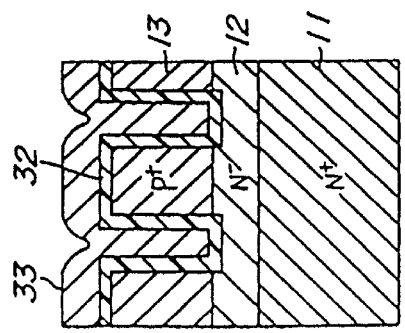

After removing the mask, a silicon oxide film 32 having a thickness of 5000Å is formed on an inner wall of the recesses 31 and on a surface of the silicon layer 13 as depicted in FIG. 6D. Further an aluminum film 33 is formed such that the recesses 31 are fully filled with aluminum. The silicon oxide film 32 is formed by thermal oxidation. The silicon oxide film 32 may be formed by CVD using a TEOS gas. The aluminum film 33 is formed by CVD method, but may be formed by sputtering.

Figure 6E:
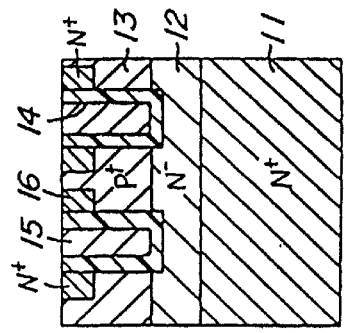
Figure 6F:
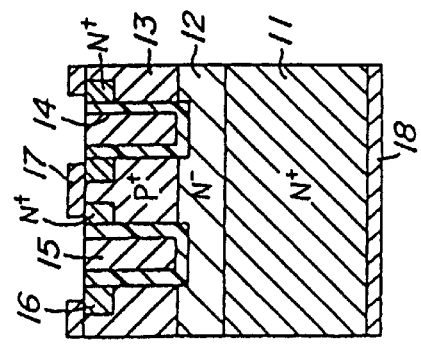

Next, the aluminum film 33 and silicon oxide film 32 are partially removed by etching or chemical mechanical polishing to expose a surface of the silicon layer 13 as shown in FIG. 6E. Then, after forming a given mask, N type impurity ions are implanted and diffused into the surface of the silicon layer 13 to form N$^+$ type source regions 16 having an impurity concentration of about $1 \times 10^{19}$ atoms/cm$^3$. Finally, as shown in FIG. 6F, source electrodes 17 are formed on the source regions 16 and a drain electrode 18 is formed on a rear surface of the silicon substrate 11 by aluminum deposition.

In the above mentioned embodiment, the semiconductor substrate is formed by the silicon substrate, silicon carbide layer epitaxially deposited on the silicon substrate, and silicon layer epitaxially deposited on the silicon carbide layer. In this case, the inversion channel has to be formed within the silicon layer and silicon carbide layer. However, if the inversion channel extends up to a boundary between the silicon substrate and the silicon carbide layer, a breakdown voltage might be reduced due to crystal incommensurate structure at the boundary. The present invention provides a novel structure which can mitigate such a problem. Now several embodiments of the semiconductor device according to the invention will be explained.

Figure 7:
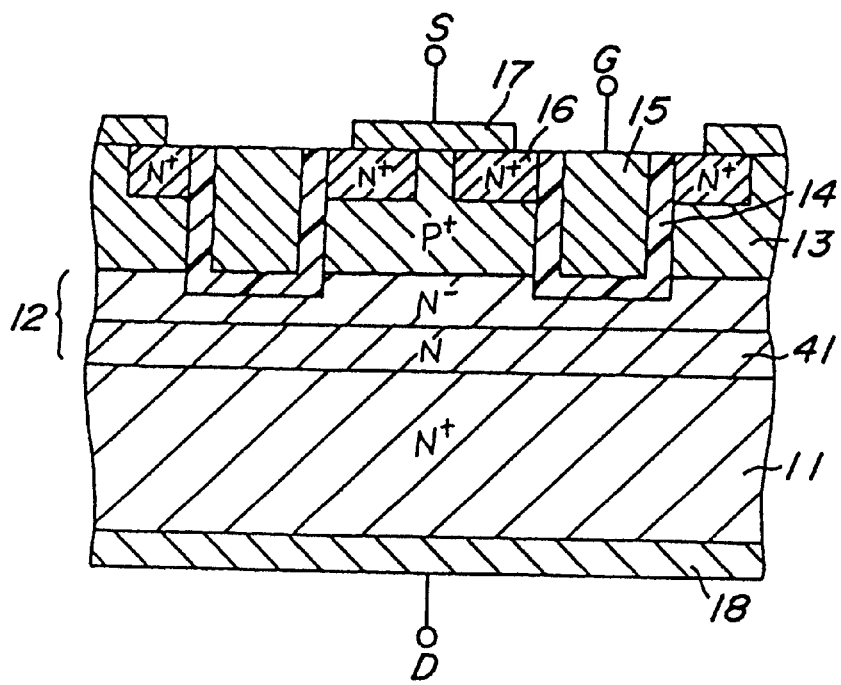
FIG. 7 is a cross sectional view illustrating a modification of the embodiment shown in FIG. 1.

FIG. 7 is a cross sectional view showing an embodiment of the semiconductor device according to the invention, in which the above explained problem of the crystal defect in the boundary between the silicon substrate and the silicon carbide layer can be solved. The basic structure of the present embodiment is identical to that of the first embodiment shown in FIG. 1. In the present embodiment, an N type diffusion layer 41 having a higher impurity concentration than that of the silicon carbide layer 12 is formed between the N$^+$ type silicon substrate 11 and the N$^-$ type silicon carbide layer 12. The N type diffusion layer 41 may be formed by diffusing impurity ions from the silicon substrate 11 into the silicon carbide layer 12 after epitaxially depositing the silicon carbide layer 12. In the present embodiment, the N type diffusion layer 41 has an impurity concentration of $5 \times 10^{17}$ atoms/cm$^3$ and a thickness of about 10 microns.

By providing the N type diffusion layer 41 in the surface region of the silicon carbide layer 12 adjoining the silicon substrate 11, the depletion layer formed at the P$^+$N$^-$ junction cannot spread beyond the boundary between the bulk portion of the silicon carbide layer 12 and the N type diffusion layer 41. In this manner, the depletion layer having a maximum electric field is formed within the same crystal without any crystal incommensurate structure, i.e. within the silicon carbide crystal. Therefore, the above mentioned decrease in the breakdown voltage due to the crystal incommensurate structure can be effectively removed.

Figure 8:
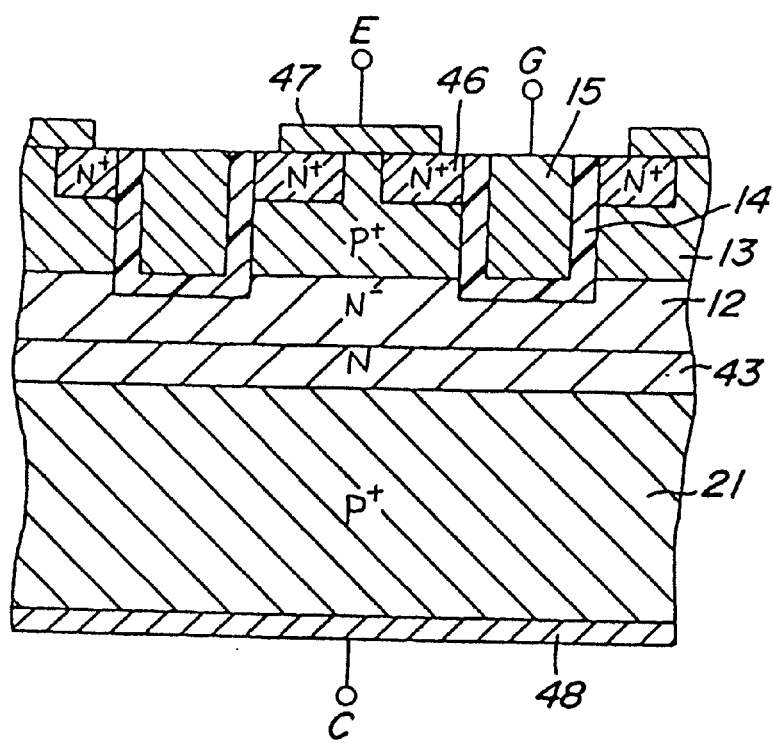
FIG. 8 is a cross sectional view showing a modified embodiment of the semiconductor device depicted in FIG. 3 according to the invention.

FIG. 8 is a cross sectional view showing a modification of the embodiment of the semiconductor device according to the invention, in which the above mentioned decrease in the breakdown voltage due to the crystal incommensurate structure can be avoided. In the present embodiment, after forming an N type silicon carbide layer 43 having a thickness of about 10 microns on the silicon substrate 11 by epitaxial growth, an N$^-$ silicon carbide layer 12 having a thickness of about 20 microns is formed on the N type silicon carbide layer 43 by epitaxial growth. The N type silicon carbide layer 43 has an impurity concentration Of $5 \times 10^{17}$ atoms/cm$^3$ which is higher than that of the N$^-$ type silicon carbide layer 12.

Figure 9:
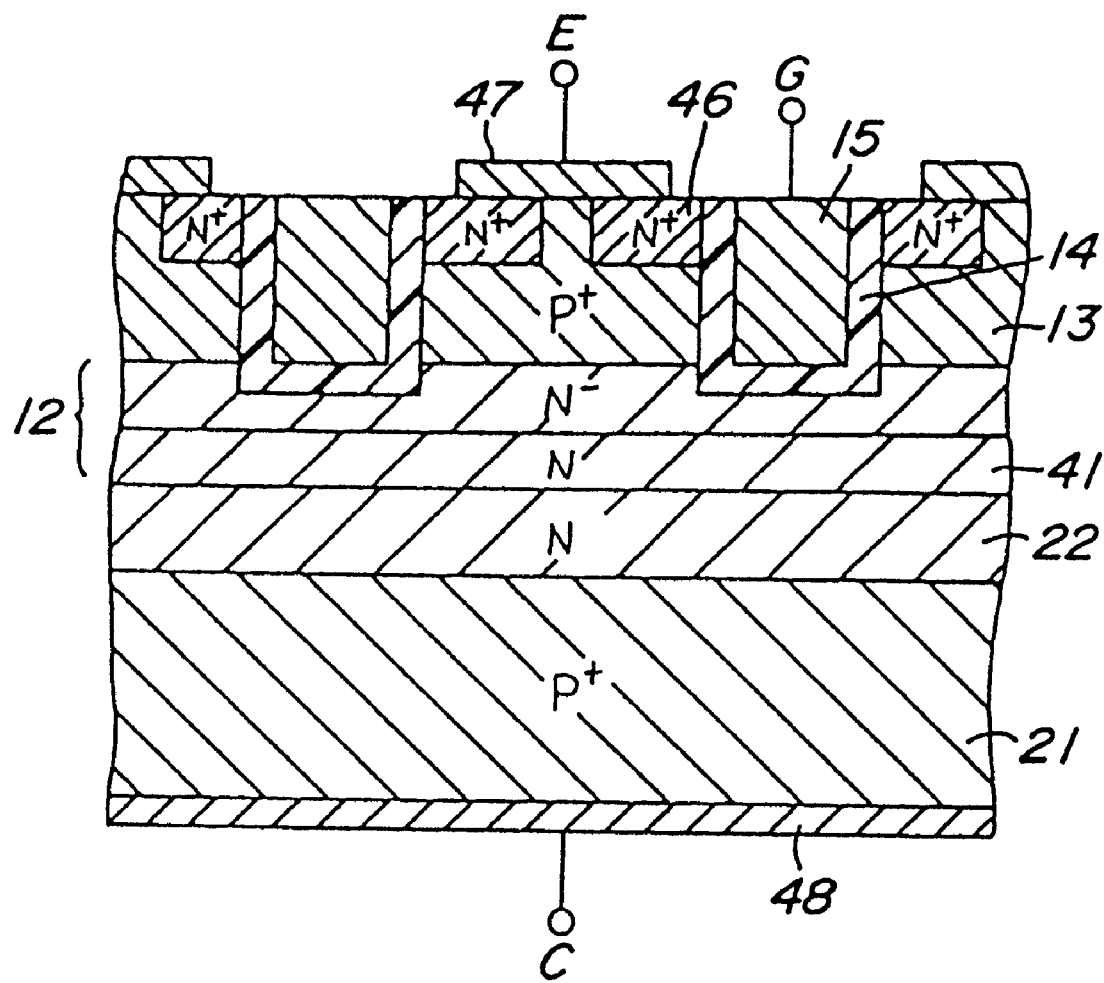
FIG. 9 is a cross sectional view showing an modification of the embodiment of the semiconductor device according to the invention shown in FIG. 2.

FIG. 9 is a cross sectional view showing a modification of the embodiment of the semiconductor device according to the invention shown in FIG. 3, in which the decrease in the breakdown voltage due to the crystal incommensurate structure can be mitigated. In the present embodiment, an N type silicon layer 22 having an impurity concentration of about $5 \times 10^{17}$ atoms/cm$^3$ and a thickness of about 10 microns is epitaxially deposited on the P$^+$ type silicon substrate 21. Then, N$^-$ type silicon carbide layer 12 having a thickness of about 20 microns is epitaxially grown on the N type silicon carbide layer 22. Then, N type impurity ions are diffused from the N type silicon layer 22 into the N$^-$ type silicon carbide layer 12 to form an N type diffusion layer 41 having a thickness of about 10 microns. This N type diffusion layer 41 has an impurity concentration of about $5 \times 10^{17}$ atoms/cm$^3$.

In the embodiments illustrated in FIGS. 7–9, the decease in the breakdown voltage due to crystal incommensurate structure at the boundary between the silicon substrate and the silicon carbide layer can be avoided. It should be noted that a similar problem might occur at a boundary between a silicon carbide layer and a silicon layer having a high impurity concentration. According to the invention, this problem can be also solved by a similar measure.

Figure 10:
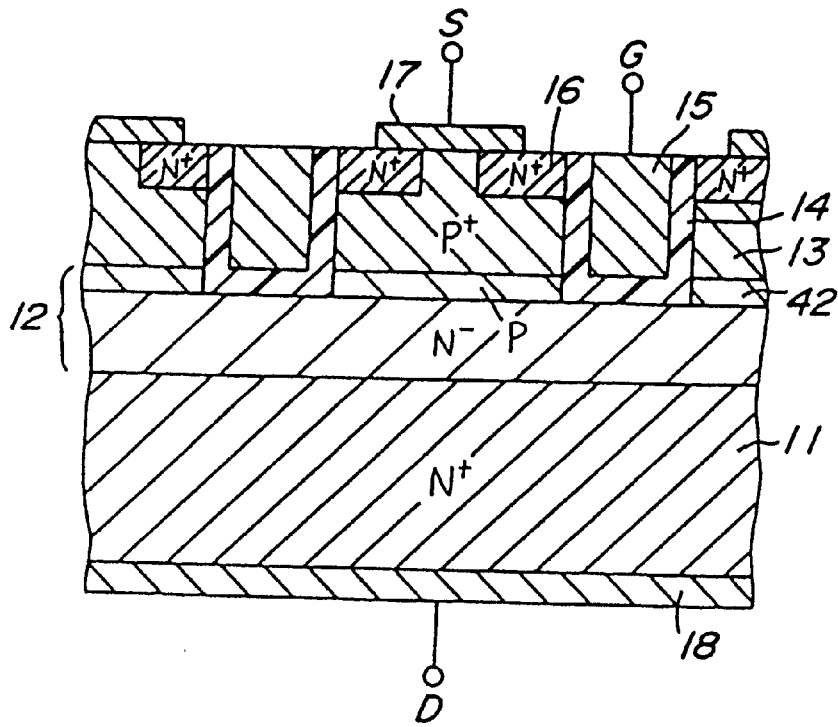
FIG. 10 is a cross sectional view showing another modification of the embodiment shown in FIG. 1.

FIG. 10 is a cross sectional view showing a modification of the embodiment shown in FIG. 1, in which the above mentioned problem can be removed by providing a diffusion layer in a surface of the silicon carbide layer adjoining the silicon layer. On an N$^+$ type silicon substrate 11 there is epitaxially formed an N$^-$ type silicon carbide layer 12 having a thickness of about 20 microns, and a P$^+$ type silicon layer 13 is epitaxially deposited on the silicon carbide layer 12. Then, P type impurity ions are diffused from the silicon layer 13 into the silicon carbide layer 12 to form a P type diffusion layer 42 having a thickness of about 5 microns. This P type diffusion layer 42 has an impurity concentration of $5 \times 10^{17}$ atoms/cm$^3$. In this manner, a P—N junction is formed within the-SiC layer 12, and therefore a semiconductor device with a high blocking capability may be obtained.

Figure 11:
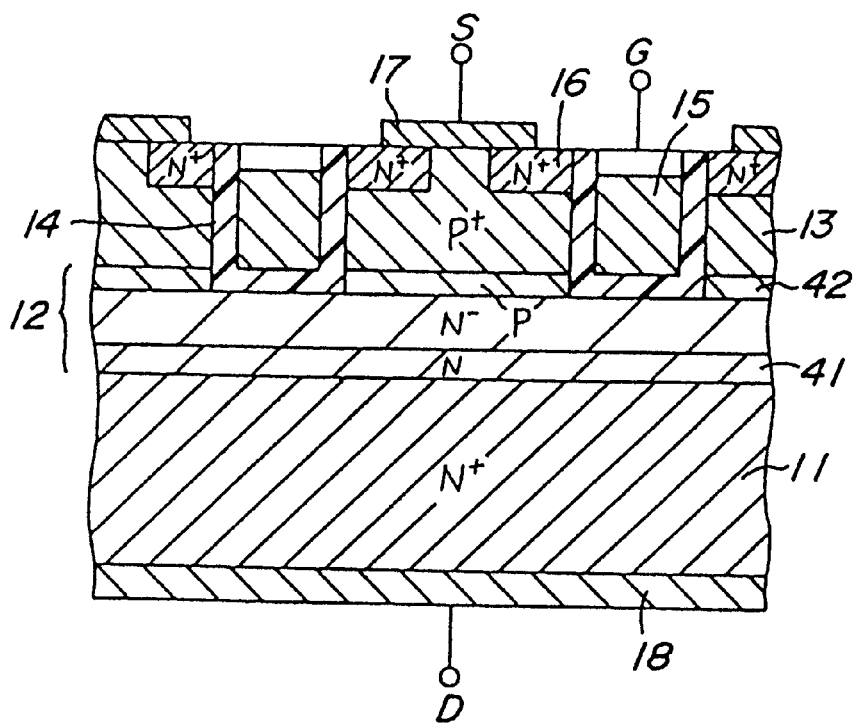
FIG. 11 is a cross sectional view illustrating another modified embodiment of the semiconductor device shown in FIG. 1.

FIG. 11 is a cross sectional view depicting another embodiment of the semiconductor device according to the invention, in which both the N type diffusion layer 41 shown in FIG. 7 and the P type diffusion layer 42 illustrated in FIG. 10 are provided. In the present embodiment, on an N$^+$ type silicon substrate 11 an N$^-$ type silicon carbide layer 12 having an impurity concentration of $5 \times 10^{15}$ atoms/cm$^3$ is epitaxially deposited. Then, an N type silicon carbide layer 41 having an impurity concentration of $3 \times 10^{18}$ atoms/cm$^3$ and a thickness of about 5 microns is formed by diffusing N type impurity ions from the silicon substrate 11 into the silicon carbide layer 12. Next, an P$^+$ type silicon layer 13 is epitaxially deposited on the silicon carbide layer 12, and then a P type diffusion layer 42 having a thickness of about 5 microns is formed in a surface region of the silicon carbide layer 12 by diffusing P type impurity ions from the P$^+$ type silicon layer 13 into the surface region of the silicon carbide layer 12. The P type diffusion layer 42 has an impurity concentration of about $5 \times 10^{17}$ atoms/cm$^3$. In the present embodiment, the bulk of the silicon carbide layer 12 becomes about 10 microns.

In the present embodiment, the N type silicon carbide layer 41 is provided between the N$^+$ type silicon substrate 11 and the N$^-$ type silicon carbide layer 12 and the P type diffusion layer 42 is existent between the N$^-$ type silicon carbide layer 12 and the P$^+$ type silicon layer 13. Therefore, in operation it is possible to avoid the decrease in breakdown voltage due to the crystal defect within the silicon carbide layer 12 at which an electric field of the depletion layer formed by reverse bias becomes maximum.

Figure 12:
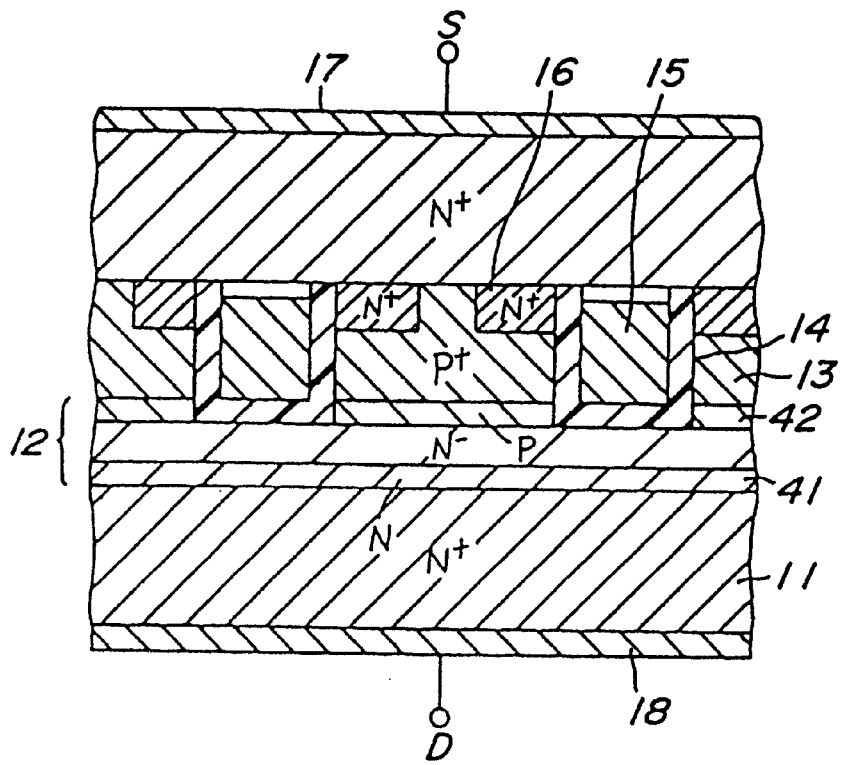
FIG. 12 is a cross sectional view showing a modification of the embodiment shown in FIG. 4.

FIG. 12 is a cross sectional view showing a modified embodiment of the power MOS FET of joint type shown in FIG. 4. In the present embodiment, an N type diffusion layer 41 is formed in a surface of an N$^-$ type silicon carbide layer 12 which adjoins with an N$^+$ type silicon substrate 11, and a P type diffusion layer 42 is formed in a surface of the N$^-$ type silicon carbide layer 12 which is brought into contact with a P$^+$ type silicon layer 13. On the N$^+$ type silicon substrate 11 an N$^-$ type silicon carbide layer 12 is epitaxially deposited, and then, an N type diffusion layer 41 is formed by diffusing N type impurity ions from the silicon substrate 11 into the silicon carbide layer 12. Next, a P$^+$ type silicon layer 13 is epitaxially deposited on the silicon carbide layer 12, and then a P type diffusion layer 42 is formed in a surface region of the silicon carbide layer 12 by diffusing P type impurity ions from the P$^+$ type silicon layer 13 into the surface region of the silicon carbide layer 12. Each of the N type diffusion layer 41 and P type diffusion layer 42 has a thickness of 5 microns, so that the bulk of the silicon carbide layer 12 becomes about 10 microns.

Figure 13:
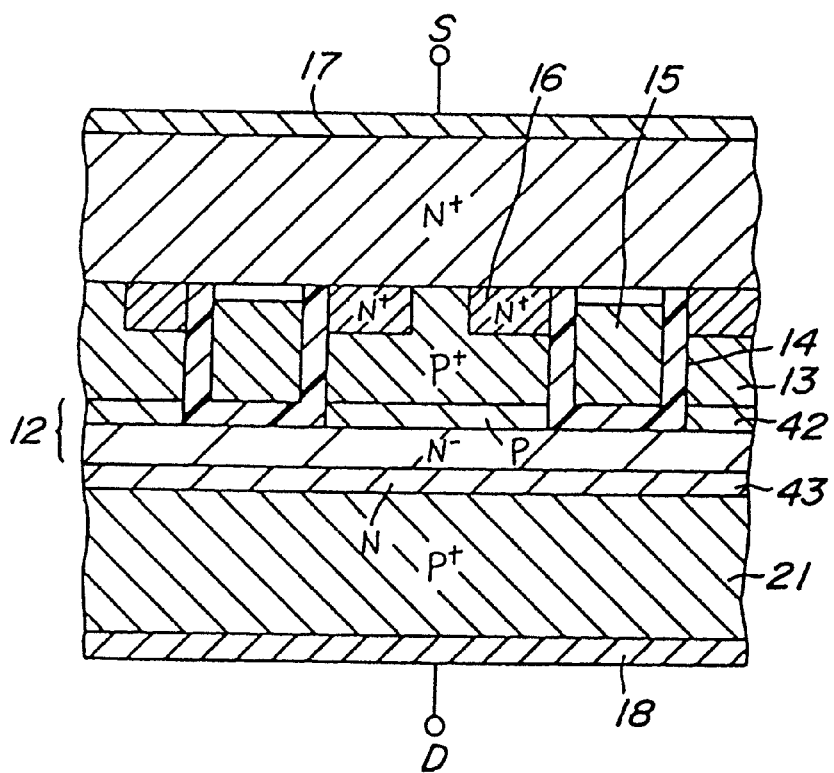
FIG. 13 is a cross sectional view representing a modification of the embodiment illustrated in FIG. 5.

FIG. 13 is a cross sectional view depicting a modification of the joint type IGBT illustrated in FIG. 5. In the present embodiment, on a P$^+$ type silicon substrate 21 is epitaxially formed an N type silicon carbide layer 43 having an impurity concentration of about $3 \times 10^{18}$ atoms/cm$^3$ and a thickness of about 5 microns. Then, an N$^-$ type silicon carbide layer 12 having a thickness of about 15 microns is epitaxially deposited on the N type silicon carbide layer 43, and a P$^+$ type silicon layer 13 is epitaxially deposited on the N$^-$ type silicon carbide layer 12. Next P type impurity ions are diffused from the P$^+$ type silicon layer 13 into the surface region of the N$^-$ type silicon carbide layer 12 to form a P type diffusion layer 42 having a thickness of about 5 microns.

FIGS. 14A–14D are cross sectional views showing several embodiments of the second semiconductor substrate used in the joint type semiconductor device. In these embodiments, lower surfaces of the substrates are to be brought into contact with the first silicon substrate. In FIG. 14A, a metal film 52 is applied on a surface of a silicon substrate 51. The metal film 52 may be formed by a vapor deposition of aluminum. In FIG. 14B, a substrate 53 is wholly formed by a metal plate. In an embodiment of FIG. 14C, recesses 55 are formed in a surface of a silicon substrate 54 and an insulating films 56 such as oxide films are formed on inner walls of the recesses. In FIG. 14D, a metal film 58 having a given pattern is formed on a surface of a silicon substrate 57 and openings of the metal film 58 are filled with insulating films 59 such as oxide films, said insulating film having a thickness smaller than that of the metal film. The insulating films 56 and 59 of the embodiments shown in FIGS. 14C and 14D correspond to the recesses in which the gate electrodes 15 are formed, and the metal films 58 of the embodiment illustrated in FIG. 14D are joined to the source or emitter regions 16.

The present invention is not limited to the embodiments explained above, but various alternations and modifications may be conceived by those skilled in the art within the scope of the invention. For instance, in the above embodiments, the recesses for forming the gate electrodes 15 are formed such that the recesses fully penetrate the P$^+$ silicon layer 13 and partially penetrate into the surface of the silicon carbide layer 12. According to the invention, the recesses may be formed such that the surface of the silicon carbide layer 12 is just exposed as shown in FIG. 15A or the recesses do not reach the boundary between the silicon carbide layer 12 and the P$^+$ silicon layer 13 as illustrated in FIG. 15B. In the embodiment shown in FIG. 15A, the recesses can be formed without fine control, because the silicon carbide layer 12 is hardly etched compared to the silicon layer 13. In the embodiment shown in FIG. 15B, the recesses are formed to such a depth that the inversion channel formed by applying a voltage to the gate electrode 15 extends just up to the boundary between the silicon carbide layer 12 and the silicon layer 13.

It should be noted that FIGS. 15A and 15b show the modifications of the embodiment formed as a MOS FET shown in FIG. 1, but according to the invention, similar modifications may be conceived for the remaining embodiments.

As explained above in detail, according to the invention, the semiconductor substrate having the hybrid structure is formed by the silicon substrate and the wide band-gap semiconductor material layer such as a silicon carbide layer and diamond layer, so that a required breakdown voltage can be attained by reducing a thickness of the semiconductor substrate. Therefore, it is possible to reduce the on-resistance, and thus an amount of generated heat can be reduced and loss due to heat can be decreased. Particularly, when the diamond layer having a high thermal conduction is used in the hybrid type semiconductor substrate, the diamond layer serves as a heat sink for dissipating heat generated by the channel, so that the heat dissipation property can be improved. It has been proposed to make a whole substrate from a wide band-gap semiconductor material, but a wide band-gap semiconductor substrate having good characteristics is very expensive and workability of the wide band-gap semiconductor substrate is rather low. According to the invention, the semiconductor substrate includes inexpensive silicon having good workability, and thus the semiconductor device having good properties can be easily manufactured at low cost.

What is claimed is:

1. A method of manufacturing a semiconductor device comprising the steps of:
   preparing a silicon substrate having first and second major surfaces and a first impurity concentration;
   epitaxially growing, on the second surface of the silicon substrate, a semiconductor material having a band-gap wider than the silicon substrate to form a wide band-gap semiconductor material layer, said wide band-gap semiconductor material layer having a second impurity concentration lower than said first impurity concentration of the silicon substrate;
   epitaxially growing a silicon layer on said wide band-gap semiconductor material layer, said silicon layer having a third impurity concentration higher than said second impurity concentration of the wide band-gap semiconductor material layer;
   forming at least one recess at least in said silicon layer by anisotropic etching;
   forming at least one silicon oxide film on an inner wall of said at least one recess;
   forming at least one gate electrode on said at least one silicon oxide film;
   forming at least one source or emitter region in a surface of the silicon layer by inverting the conductivity type of a portion of the silicon layer which adjoins the silicon oxide film;
   forming at least one source or emitter electrode on said at least one source or emitter region; and
   forming a drain or collector electrode on said first major surface of the silicon substrate.

2. A method according to claim 1, wherein said at least one recess is formed such that the recess partially penetrates into the wide band-gap semiconductor material layer.

3. A method according to claim 1, wherein said at least one recess is formed such that a surface of said wide band-gap semiconductor material layer is just exposed at a bottom of the recess.

4. A method according to claim 1, wherein said at least one recess is formed within said silicon layer such that a distance between a bottom of the recess and a surface of the wide band-gap semiconductor material layer is equal to a depth of an inversion channel formed in the silicon layer during operation of semiconductor device.

5. A method according to claim 1, wherein after forming said wide band-gap semiconductor layer, impurity ions are diffused from the silicon substrate into the wide band-gap semiconductor material layer to form a diffusion layer in a surface of the wide band-gap semiconductor material layer, said diffusion layer having an impurity concentration lower than the silicon substrate, but higher than the wide band-gap semiconductor material layer.

6. A method according to claim 1, wherein after forming the silicon layer on the wide band-gap semiconductor material layer, impurity ions are diffused from the silicon layer into the wide-band gap semiconductor material layer to form a diffusion layer in a surface of the wide band-gap semiconductor material layer.

* * * * *